United States Patent

Fuller

[15] 3,653,999

[45] Apr. 4, 1972

[54] METHOD OF FORMING BEAM LEADS ON SEMICONDUCTOR DEVICES AND INTEGRATED CIRCUITS

[72] Inventor: Clyde Rhea Fuller, Plano, Tex.

[73] Assignee: Texas Instruments Incorporated, Dallas, Tex.

[22] Filed: Sept. 25, 1970

[21] Appl. No.: 75,635

[52] U.S. Cl. ....................................156/11, 156/13, 156/17, 317/234 N, 317/234 M, 317/234 L, 29/578, 29/587, 117/212, 117/217, 204/15, 204/192

[51] Int. Cl. ..........................................H01l 7/50, H05k 1/04

[58] Field of Search .....................156/11, 13, 17; 317/234 N, 317/234 M, 234 L; 204/15, 192; 29/587, 578; 117/212, 217

[56] References Cited

UNITED STATES PATENTS

| | | | |
|---|---|---|---|
| 3,556,951 | 1/1971 | Cerniglia et al | 204/15 |
| 3,367,806 | 2/1968 | Cullis | 156/17 |

*Primary Examiner*—Jacob H. Steinberg
*Attorney*—Harold Levine, James O. Dixon, Andrew M. Hassell, Melvin Sharp, Henry T. Olsen, Michael A. Sileo, Jr., Gary C. Honeycutt and John E. Vandigriff

[57] ABSTRACT

Disclosed is an improved method for forming corrosion resistant beam lead connectors on semiconductor devices such as integrated circuits. A barrier layer of a titanium and tungsten alloy is deposited over the surface of the integrated circuit. A layer of gold is then deposited over the barrier layer. The layer of gold is patterned to define interconnection paths between the various devices of the integrated circuit and beam lead connection geometries, using photoresist and a gold etchant. The titanium-tungsten barrier layer is left intact during this step. The photoresist pattern is removed and a second pattern is applied to cover all areas of the integrated circuit except those areas where beam leads are desired. An additional layer of gold is plated to the appropriate thickness to form the beam leads, the photoresist pattern effecting a plating stop-off and the titanium-tungsten layer providing electrical continuity across the slice. Electrical separation between beam lead connectors and device interconnection paths is effected by etching the titanium-tungsten alloy with an etchant that attacks only the alloy, leaving the gold geometries intact.

6 Claims, 6 Drawing Figures

Patented April 4, 1972 3,653,999

INVENTOR
Clyde Rhea Fuller

BY Michael A. [signature]

WITNESS Richard L. Donaldson

ATTORNEY

METHOD OF FORMING BEAM LEADS ON SEMICONDUCTOR DEVICES AND INTEGRATED CIRCUITS

This invention relates to semiconductor devices and more particularly to an improved method for forming corrosion resistant beam lead connectors on a wafer which has an integrated circuit formed thereon.

The semiconductor industry has been searching for some time for a better and less expensive way to encapsulate semiconductor devices. One method that has been widely used is to mount the device on a metal and glass header and completely encapsulate the device within a metal can. This technique, however, is extremely expensive. Other less expensive ways of encapsulating semiconductor devices have been utilized; such as, for example, encapsulating the device in epoxy or silicon polymers by transfer molding. Another technique that has been utilized is to affix a metal cap to a ceramic base using a strong organic adhesive such as an epoxy resin.

It is generally agreed, however, that the seal provided by methods other than the header and can arrangement is not hermetic to the extent typical in the metal and glass encapsulated devices. Thus, while methods other than the header and can arrangement are less expensive, they permit a greater amount of ambient gases to penetrate the semiconductor package.

Ambient gas penetration of semiconductor packages results in corrosion of the thin metal layers used to make the contact leads and the interconnections to the different regions of the semiconductor devices and is of considerable concern to the semiconductor industry. This corrosion is generally caused by penetration of the package by ambient water vapors. While corrosion of the thin metal layer is minimized in single devices due to the minimum amount of metal films necessary to complete interconnection, corrosion still occurs at lead/bonding pad locations, especially where dissimilar metals are used. The corrosion problem is more highly apparent in multi-component devices such as integrated circuits, which typically have a large number of active and passive components such as transistors, capacitors and resistors.

Conventionally the various components making up the integrated circuit are formed by diffusion beneath the surface or major face of a semiconductor wafer. An insulating layer is formed to overlie the face of the wafer. Windows are opened in the insulating layer to expose portions of the semiconductor wafer surface for interconnect and contact purposes. Thin layers of a metal are deposited over the insulating layer to interconnect in a predetermined pattern the various regions of the semiconductor device exposed by the windows formed in the insulating layer. The total area of these thin metal layers is usually very high in integrated circuits, as compared to a single device, because of the necessary interconnection between the different regions. Since more surface area of interconnecting metal layers is exposed to ambient gases, there is a greater chance for corrosion. As the complexity of interconnection patterns increases, it is often necessary to form more than one level of metallized interconnections. Individual levels, of course, are electrically isolated by various layers of insulating material at the crossover points. Although the lower layers are thus isolated from the ambient, the top most or last layer of interconnection still is usually exposed to ambient gases and thus experiences corrosion.

In an attempt to reduce corrosion in non-hermetic enclosures, various techniques have been utilized, such as, for example, forming a barrier layer of a refractory metal, such as titanium to overlie the semiconductor device. This barrier layer preferably has both a high oxygen activity refractory nature and good adherence properties with respect to silicon oxide. One technique that has been proposed in order to provide greater corrosion resistance is to utilize a metallic barrier layer of tungsten and a modifier metal. Such a metallization system is described in co-pending application Ser. No. 17,040 filed Mar. 9, 1970, (TI-3240A) in the names of James A. Cunningham and Clyde R. Fuller, and assigned to the assignee of the present invention.

In addition to having corrosion resistant characteristics, it is also desirable that the metallization system used for the integrated circuit interconnect paths also be compatible with processes for forming beam lead contacts that extend from the wafer for connection to circuitry off of the wafer. A technique for forming beam leads is described in "Beam Lead Technology," M.P. Lepselter, *The Bell System Technical Journal*, page 233 et seq., February, 1966. This type of beam lead structure simplifies assembly of semiconductor circuits and is compatible with batch fabricating techniques.

In forming beam lead structures as described in the above referenced Lepselter article, the starting material may be, for example, a slice of standard planar oxidized silicon devices with contact holes etched in the silicon oxide insulating layer. Platinum silicide is utilized to form an ohmic contact to the silicon. A composite layered structure of titanium-platinum-gold is utilized to bond to the silicon dioxide insulating layer and the platinum silicide and to serve an electrical connection to external circuitry. The layered titanium-platinum-gold structure is required since gold is a metallurgically reactive material and reacts with titanium chemically at relatively low temperatures to form compounds which have none of the desired characteristics of the individual metals. Therefore, platinum is used as a protective layer to separate the gold from the titanium. The problem with the above described metallization system, however, is that platinum etches far more slowly than gold in all of the etchants conventionally used to etch the platinum. This is particularly true in aqua regia, the etchant normally employed. Therefore, in the titanium-platinum-gold metallization system, the gold conductive layer cannot be deposited until the platinum is patterned to define the desired interconnect and beam lead geometry. A photoresist pattern then must be applied to cover all the exposed titanium regions. This masking process must be extremely precise and is very tedious and expensive and does not readily lend itself to forming intricate geometries. The patterned platinum areas of the device are then plated with gold to a thickness appropriate for the interconnection paths, the photoresist covering the titanium acting as a plating stop-off and the underlying titanium serving to maintain electrical continuity over the slice. The photoresist is then removed and a third pattern is applied for plating the beam leads to the required thickness. Inasmuch as the platinum layer must first be patterned to define the device geometry and then masked in a precise manner prior to plating of the gold layer, the titanium-platinum-gold metallization system is not readily adaptable to large scale economical production of corrosion resistant beam leads.

Accordingly it is an object of the present invention to provide an improved method for forming corrosion resistant beam leads on semiconductor devices and integrated circuits.

Another object of the present invention is to provide an improved method for forming corrosion resistant beam leads on semiconductor devices and integrated circuits using a barrier layer of an alloy of titanium-tungsten to overlie the surface of the semiconductor material.

It is a further object of the present invention to provide a method for defining beam lead geometries by etching through selected areas of a unitary layer of gold with an etchant that selectively attacks the gold but does not attack the titanium:tungsten protective layer.

Still another object of the present invention is to provide an improved method for defining beam lead and interconnect patterns wherein geometries much more complex and intricate than heretofore possible may be obtained.

Another object of the present invention is to provide an improved method of defining beam lead and interconnect geometries requiring less critical etching processes by utilizing a selective etch that attacks the titanium-tungsten alloy but does not attack gold and which will not significantly undercut the gold even when overexposed to the etch for a time exceeding as much as 300 percent of the required etching time.

Briefly and in accordance with the present invention, a titanium-tungsten alloy is used to protect against corrosion and to provide a protective barrier between the gold conductive layer and the semiconductor material. Diffusions, insulations, contact oxide removals and platinum silicide ohmic contact processes are effected to define the desired device or integrated circuit. A layer of titanium-tungsten is then deposited over the device followed by a layer of gold. The gold is patterned to define the device interconnections and beam lead geometries using photoresist and a gold etchant, thereby exposing various areas of the titanium:tungsten layer. The photoresist pattern is removed and a second pattern is applied covering all areas of the device except the areas where beam leads are to be formed. The beams are plated with gold to an appropriate thickness, the photoresist acting as a plating stop-off and the titanium-tungsten layer providing electrical continuity across the slice to effect the plating. The photoresist pattern is then removed and interconnection and beam lead electrical separation is effected by etching the titanium-tungsten in an etchant that attacks the titanium:tungsten but that does not attack the gold. Preferably the etchant is hydrogen peroxide. When protected by silicon polymers, the titanium-tungsten-gold metallization system is as resistant to corrosion as the titanium-platinum-gold system and a decided advantage is gained by eliminating a photoresist step that requires precise alignment. Further, since the interconnect and beam lead geometries are defined by etching the gold rather than by plating, as conventionally done, very precise and intricate geometries may be formed.

The novel features believed to be characteristic of this invention are set forth in the appended claims.

The invention, itself, however, as well as other objects and advantages thereof may best be understood by reference to the following detailed description when read in conjunction with the accompanying drawings wherein.

Figure 1:
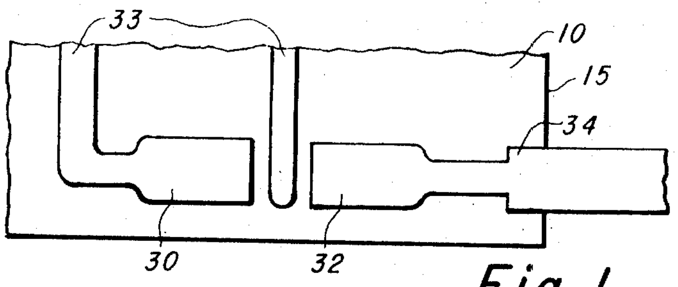
FIG. 1 is a partial plan view of a wafer of semiconductor material in which a beam lead is connected to a metal oxide semiconductor field effect transistor in accordance with the method of the present invention.
Figure 2:
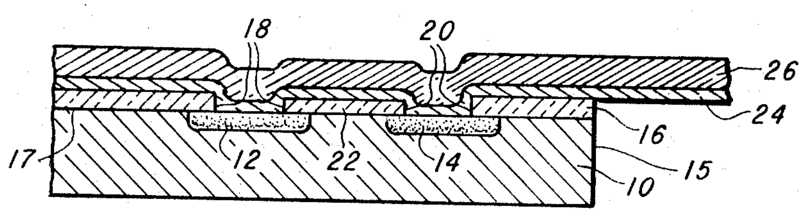
FIGS. 2–5 are cross-sectional views of the device of FIG. 1 taken along section line A—A′ depicting various stages of fabrication of the beam lead contact shown in FIG. 1.

Referring now to the drawings and for the present particularly to FIGS. 1 and 2, there is illustrated a beam lead connected in accordance with the fabricating method of the present invention to that portion of an integrated circuit containing an insulated gate field effect transistor. In this embodiment a silicon wafer 10 of N-type conductivity is used as the starting material. Two P-type regions or elements 12 and 14 are diffused into the wafer using conventional techniques such as photomask and successive diffusion. Such techniques are known in the art and are not a part of the present invention. For a full description of these fabrication techniques refer to *Integrated Circuits — Design Principles and Fabrication*, Raymond M. Warner, Jr. and James N. Fordenwalt, McGraw Hill (1965); *Silicon Semiconductor Technology, McGraw Hill* (1965); and *Physics and Technology of Semiconductor Devices*, A. S. Grove, Wylie and Sons (1967). It is to be appreciated, of course, that materials of opposite conductivity from that described herein could be used in accordance with the present invention.

An insulating layer 16 of, for example, silicon dioxide, is formed on the upper surface 17 of the wafer 10. Openings are photoetched into the outside layer 16 and P-type diffusion regions are effected to form the source and drain elements 12 and 14 respectively of a field effect transistor. Thereafter a thin layer 22 of silicon dioxide is formed over the gate area of the device by first removing the original outside oxide layer present over the gate area and then redepositing a thin layer of silicon dioxide over the entire surface of the wafer. Thereafter, openings 18 and 20 are photoetched into the new silicon dioxide layer to form contact regions to the source and drain. A summary of this technique is described in "Large-Scale Integration and Electronics," F. G. Heath, *Scientific American*, January 1970, pages 28–29.

The size of the semiconductor wafer 10 is selected for convenience in handling and is normally a part of the slice of silicon approximately 1 ½ to 2 inches in diameter and 10 mils thick. After processing of the slice, the wafers are separated by etching through the silicon remaining between the wafers.

In order to provide good ohmic contact to the wafer, platinum silicide is formed at the oxide openings where contact with the silicon is to be made. This is effected by depositing platinum, sintering at about 650° C., and removing the platinum from over the silicon dioxide layer, leaving a region of platinum silicide at the contact openings such as at 18 and 20 of FIG. 2.

In the next step, a layer 24 of a titanium:tungsten alloy is applied utilizing a conventional r.f. sputtering technique. Titanium concentrations in excess of about 4 percent produce "pseudo alloys" or mixtures where the excess titanium is not actually alloyed or dissolved in the tungsten, but the increased percentage of titanium does nevertheless impart desirable corrosion resistant characteristics to the tungsten. The weight percentage of titanium is not critical and values from 3 to 60 percent or more may be used. Preferably about 10 to 20 percent by weight of titanium is used.

A supporting structure (not shown) which is a part of the larger slice of silicon is provided so that the tungsten:titanium layer 24 which is deposited onto the silicon dioxide layer 16 and into the openings 18 and 20 can extend out beyond the edge 15 of the silicon wafer 10 and the silicon dioxide layer 16. The tungsten-titanium layer 24 is typically deposited to a thickness of from 1,000–4,000 A. Thereafter a layer 26 of gold, usually from 3,000–10,000 A thick, is deposited by evaporation techniques over the layer 24 of Ti:W.

Figure 6:
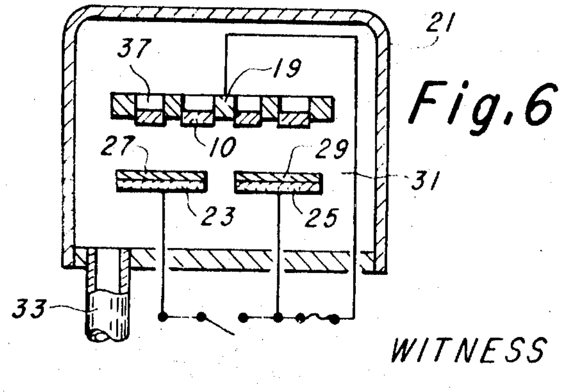
FIG. 6 is a pictorial view, partly in section, illustrating an r.f. sputtering apparatus suitable for applying the titanium:tungsten and gold layers in accordance with the present invention.

The Ti:W layer 24 and the gold layer 26 may be deposited by using conventional r.f. sputtering apparatus, such as is shown at 21 in FIG. 6. With reference to FIG. 6, the support plate 19 acts as the anode in the r.f. sputter target 27, comprising the Ti:W alloy which is desired to be deposited on the wafer 10. There will be as many targets as there are different metals to be deposited. The r.f. target plate 27 may be easily formed by conventional powder metallurgy methods. The Ti:W target plate is formed from a homogeneous mixture of tungsten and titanium powder; thus it is obvious that any desired percentage combination is easily obtainable. The target plate 27 is supported by the support plate 23, which is electrically connected through a switching arrangement to an r.f. power source (not shown).

For gold deposition, the gold target 29 is placed on its support plate 25 which in turn is also connected by a switching arrangement to an r.f. power source. The slices reside on a substrate plate 37 which may be floating, grounded, or biased as circumstances require. This substrate plate should either have the semiconductor device slices so arranged as to cover an area less than that of the target area or be rotatable so that all the slices will be rotated equally over the target to obtain uniformity.

In operation, argon, for example, under pressure of about 5–15 millitorr is introduced through the opening 33 into the r.f. sputtering apparatus 21. The r.f. energy is applied between the support plate 19 and the Ti:W target plate 27 at a frequency of about 15 megahertz for a period of time sufficient to form a layer of Ti:W on the wafer 10 having a thickness of about 2,500 A. When the desired thickness of Ti:W is obtained, the r.f. energy is disconnected and reapplied between the support plate 19 and the gold target plate 29. The r.f. energy is applied for a period of time sufficient to form the layer of gold on the previously deposited Ti:W layer to a thickness of about 10,000 A. After the desired thickness of gold is obtained, the energy source is disconnected from the apparatus 21, the argon flow turned off, and the wafer 10 removed. The Ti:W layer 24, in addition to being deposited by the r.f. sputtering described, may also be applied by triode sputtering. The gold layer may also be deposited by conventional evaporation methods if so desired.

Figure 3:
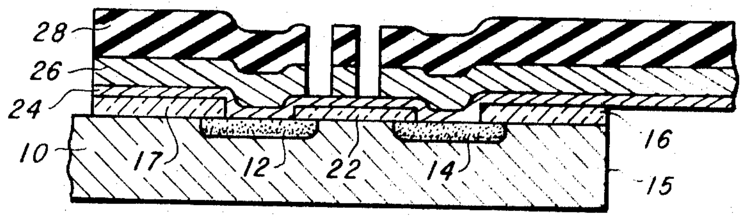
Figure 4:
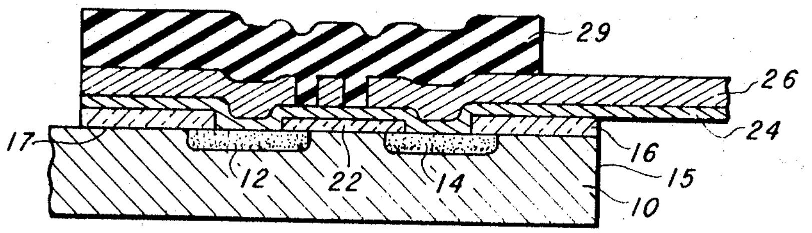

After removing the slices including wafer 10 from the r.f. sputtering apparatus 21, the excess portion of the gold and Ti:W layers 26 and 24 respectively are removed by subjecting the silicon slices to selective photoresist masking and etching treatments. With reference to FIG. 3, a thin coating 28 of a photoresist polymer, Eastman Kodak's KMER, for example, is applied to the entire top surface of the gold layer 26. The photoresist is exposed to ultraviolet light through a mask which allows light to reach the areas where the gold and Ti:W layers are to remain; such as, for example, over the expanded contact areas 30 and 32 in FIG. 1, the interconnection leads 33, and the beam leads 34. The unexposed photoresist is then removed by developing in a photodeveloping solution. At this juncture a coating of photoresist overlies the portion of the gold and Ti:W layers which form the expanded contact areas, interconnection areas, and beam leads, as shown in FIG. 1.

The slice is then subjected to an etching solution to remove the unmasked portions of the gold layer 26. A suitable etchant for gold is an alcoholic iodine plus potassium iodide solution. The gold is subjected to the solution for a period sufficient to remove the unmasked gold and to form a pattern of the gold layer 26 corresponding to the required device interconnection and beam lead geometries. The Ti:W layer 24 is left intact under the areas where the gold is etched away since the gold etchant does not attack the Ti:W. In forming the mask 28 and etching the gold layer 26, intricate circuit geometry may be formed. The interconnection geometry so defined is complete and requires no additional photoresist alignment and processing steps. This is to be distinguished from the titanium-platinum-gold system wherein an additional precisely aligned mask is required in order to plate the gold corresponding to the required device interconnection and beam lead geometries.

Figure 5:
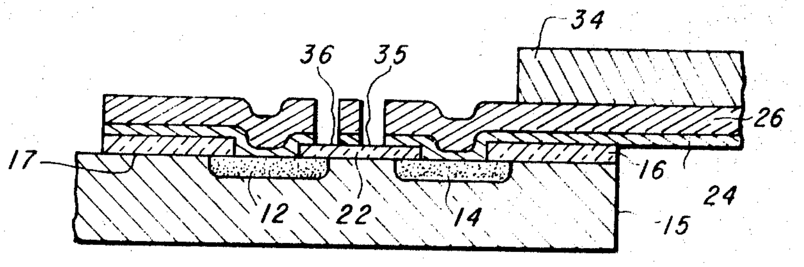

In the next step, the photoresist layer 28 is removed and a second layer of photoresist 29 is applied. The layer 29 covers all areas of the slice except the beams 34. The beams are then gold plated to the appropriate thickness using the photoresist 29 as a plating stop-off and the Ti:W layer for electrical continuity across the slice. With reference to FIG. 5, the beam 34 may typically be formed to a thickness of from about 10,000 to 100,000 A.

The photoresist pattern 29 is next removed and interconnect and beam lead electrical separation is effected by etching the Ti:W layer 24 with a suitable etchant, in areas such as, for example, 35 and 36 of FIG. 5. Various etchants may be used to attack the Ti:W layer including hydrogen peroxide, sodium peroxide, and alkaline potassium fericyanide followed by hydrochloric acid. In the preferred embodiment, hydrogen peroxide is used as the etchant. In accordance with the present invention, it has been discovered that some unusual and advantageous results are obtained when using hydrogen peroxide. First, junction biasing does not appear to affect the rate of etch of the Ti:W by the hydrogen peroxide. Therefore, an equal amount of etching is obtained on all circuit parts of the integrated circuit. Such is not the case, however, when other etchants are used. An additional advantage is obtained in that very little undercutting occurs when hydrogen peroxide is used as the etchant. For example, with a 300 percent over etch, the undercutting is less than about 2,000 A. The reason for this reduced undercutting is not fully understood but apparently the presence of the gold, once the gold beam is exposed in a prior gold etching step, sets up an electrochemical bias that reduces the etching rate of the hydrogen peroxide with respect to the Ti:W under the gold. An additional advantage is obtained using hydrogen peroxide in that a single constituent etchant may be used. The hydrogen peroxide may be obtained from commercial sources in concentration ranges of 30–35 percent and is preferable used at this concentration at room temperature. If a lesser concentration of the hydrogen peroxide is used, such as for example, 5 percent concentration, it is preferred that a temperature in the range of 50°–60° C. be used.

If sodium peroxide is used as the etchant, it is preferred that the concentration be in the range of 1–5 percent and that the temperature be maintained in the range from room temperature to 50° C.

At this stage of fabrication the device is essentially as depicted in FIG. 5. As understood by those skilled in the art, subsequent processing steps will conventionally be effected to package the device, etc. These processing steps are well known in the art and do not form a part of the present invention. When the beam lead contacts fabricated in accordance with the present invention are protected by silicone/polymers they exhibit corrosion resistant characteristics substantially equivalent to the corrosion resistance of the titanium-platinum-gold system. Additionally, a decided advantage is gained in using the method of the present invention in that a critical photoresist step required in the titanium-platinum-gold system is eliminated thereby simplifying the processing steps and enabling fabrication of more detailed geometries.

After the beam structure 34 is plated onto the underlying deposited layer of gold 26, the semiconductor wafer and associated lead structure and insulating layers are mounted in a suitable capsule. These encapsulation techniques are also known to those skilled in the art and therefore will not be elaborated. Of course the encapsulation techniques to which the present invention is especially adapted are those in which a non-hermetic structure is desired.

Additionally it is to be appreciated by those skilled in the art that the method of the present invention may be utilized with an integrated circuit requiring multiple levels of metallization.

The present invention provides an improved method for forming corrosion resistant beam leads on semiconductor devices and integrated circuits wherein a Ti:W layer is used as a barrier between the semiconductor material and the gold interconnect layer. Variations upon the present invention will be apparent to those of ordinary skill in the art. Although the foregoing description relates to the preferred embodiments of the present invention, it is intended that the invention be limited only by the limitations of the following claims.

What is claimed is:

1. A method of forming corrosion resistant electrical interconnections and beam lead connections to a semiconductor device or integrated circuit having a plurality of circuit components formed adjacent one surface of a substrate and an insulating layer upon said one surface having a plurality of openings exposing portions of said circuit components wherein the improvement comprises the steps of:

a. depositing a layer of titanium:tungsten over said insulating layer and exposed portions of said circuit components;

b. depositing a first layer of gold over said titanium-tungsten to a thickness suitable for interconnection paths;

c. exposing through a first mask selected portions of said first gold layer to define a preselected beam lead and interconnection geometry;

d. etching said exposed areas of said first gold layer with an etchant that selectively attacks gold to thereby expose portions of said titanium-tungsten layer thereunder;

e. forming a second mask over the surface of said integrated circuit to expose only the desired beam lead geometry;

f. depositing a second layer of gold over said exposed beam lead geometry to a thickness suitable for beam leads, said second mask preventing gold from being deposited on areas covered thereby;

g. removing said second mask thereby exposing selected areas of said layer of titanium:tungsten; and h. etching through said exposed areas of the titanium-tungsten layer with an etchant that selectively attacks only the titanium:tungsten thereby to electrically isolate the respective beam leads and interconnection geometries.

2. The method in accordance with claim 1 wherein platinum silicide is formed in the exposed portions of the oxide mask to make good ohmic contact to the exposed circuit components prior to the step of depositing the layer of titanium:tungsten.

3. The method in accordance with claim 2 wherein the titanium-tungsten etchant is selected from the group consisting of hydrogen peroxide, sodium peroxide, and alkali potassium fericyanide followed by hydrochloric acid.

4. The method in accordance with claim 2 wherein said titanium:tungsten etchant is hydrogen peroxide, having a concentration in the range of from 5 to 35 percent.

5. The method in accordance with claim 4 wherein said hydrogen peroxide has a concentration in the range of 30–35 percent.

6. The method in accordance with claim 5 wherein said layer of titanium:tungsten is formed to a thickness in the range of 1,000–4,000 A, said first gold layer is formed to have a thickness in the range of from 3,000–10,000 A and said second layer of gold is formed to have a thickness in the range of 10,000–100,000 A.

* * * * *